(12) United States Patent
Isobe et al.

(10) Patent No.: US 9,633,736 B2
(45) Date of Patent: *Apr. 25, 2017

(54) SEMICONDUCTOR MEMORY DEVICE CAPABLE OF REDUCING CHIP SIZE

(71) Applicant: KABUSHIKI KAISHA TOSHIBA, Minato-ku (JP)

(72) Inventors: Katsuaki Isobe, Yokohama (JP); Noboru Shibata, Kawasaki (JP); Toshiki Hisada, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/812,771

(22) Filed: Jul. 29, 2015

(65) Prior Publication Data

US 2015/0332774 A1 Nov. 19, 2015

Related U.S. Application Data

(63) Continuation of application No. 13/608,713, filed on Sep. 10, 2012, now Pat. No. 9,129,688, which is a (Continued)

(30) Foreign Application Priority Data

Jul. 17, 2009 (JP) ................................. 2009-169258

(51) Int. Cl.
*G11C 16/14* (2006.01)
*G11C 16/26* (2006.01)
(Continued)

(52) U.S. Cl.
CPC .............. *G11C 16/14* (2013.01); *G11C 5/025* (2013.01); *G11C 16/0483* (2013.01);
(Continued)

(58) Field of Classification Search
CPC ................................. G11C 5/025; G11C 16/14
See application file for complete search history.

(56) References Cited

U.S. PATENT DOCUMENTS 5,898,616 A * 4/1999 Ono ................... G11C 16/0416
365/185.11
7,245,533 B2 7/2007 Shibata
(Continued)

FOREIGN PATENT DOCUMENTS

JP 8-46159 2/1996
JP 10-144892 A 5/1998
(Continued)

OTHER PUBLICATIONS

Office Action issued Jun. 4, 2013 in Japanese Patent Application No. 2009-169258 (with English language translation).

*Primary Examiner* — Vanthu Nguyen
(74) *Attorney, Agent, or Firm* — Oblon, McClelland, Maier & Neustadt, L.L.P.

(57) ABSTRACT

According to one embodiment, a first well of the first conductivity type which is formed in a substrate. a second well of a second conductivity type which is formed in the first well. The plurality of memory cells, the plurality of first bit line select transistors, and the plurality of second bit line select transistors are formed in the second well, and the plurality of first bit line select transistors and the plurality of second bit line select transistors are arranged on a side of the sense amplifier with respect to the plurality of memory cells of the plurality of bit lines.

16 Claims, 9 Drawing Sheets

Related U.S. Application Data continuation of application No. 12/817,697, filed on Jun. 17, 2010, now Pat. No. 8,295,090.

(51) Int. Cl.
*G11C 5/02* (2006.01)
*G11C 16/04* (2006.01)
*G11C 16/16* (2006.01)
*H01L 27/11519* (2017.01)
*H01L 27/11524* (2017.01)

(52) U.S. Cl.
CPC ............ *G11C 16/16* (2013.01); *G11C 16/26* (2013.01); *H01L 27/11519* (2013.01); *H01L 27/11524* (2013.01)

(56) References Cited

U.S. PATENT DOCUMENTS

| | | | |
|---|---|---|---|
| 7,259,985 B2 | 8/2007 | Maejima | |
| 7,366,018 B2 | 4/2008 | Shibata | |
| 7,400,534 B2 | 7/2008 | Maejima | |
| 7,505,311 B2 | 3/2009 | Maejima | |
| 7,663,937 B2 | 2/2010 | Park | |
| 7,733,695 B2 | 6/2010 | Kim et al. | |
| 7,839,686 B2 | 11/2010 | Shibata | |
| 8,174,903 B2 * | 5/2012 | Han | G11C 16/0483 365/185.22 |
| 8,315,094 B2 | 11/2012 | Kanda et al. | |
| 2007/0253272 A1 | 11/2007 | Shibata | |
| 2008/0225604 A1 | 9/2008 | Park | |

FOREIGN PATENT DOCUMENTS

| | | |
|---|---|---|
| JP | 2006-80157 A | 3/2006 |
| JP | 2007-149339 A | 6/2007 |
| JP | 2007-172769 A | 7/2007 |
| JP | 2007-280547 A | 10/2007 |
| JP | 2008-85249 A | 4/2008 |

* cited by examiner

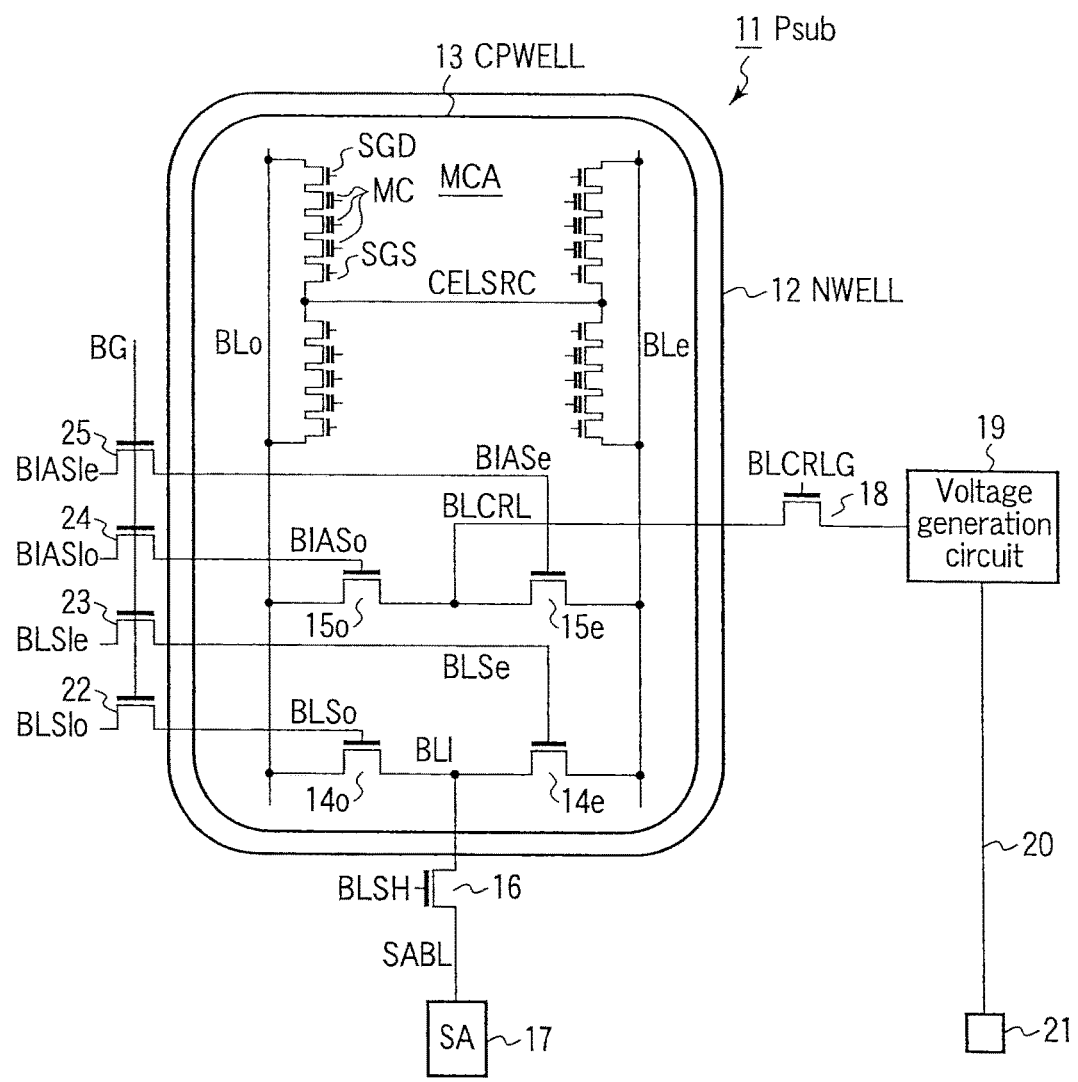
F I G. 1

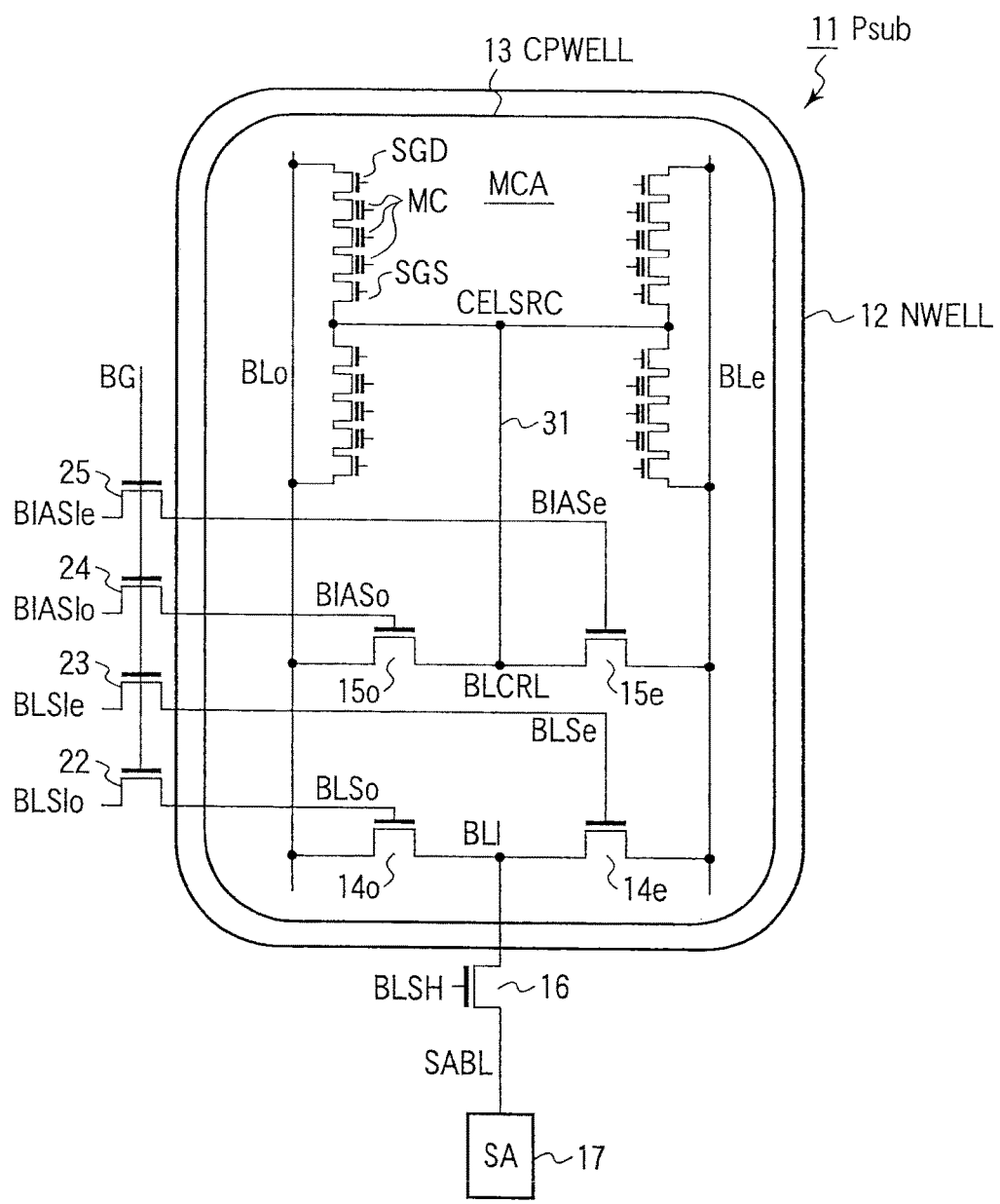
F I G. 3

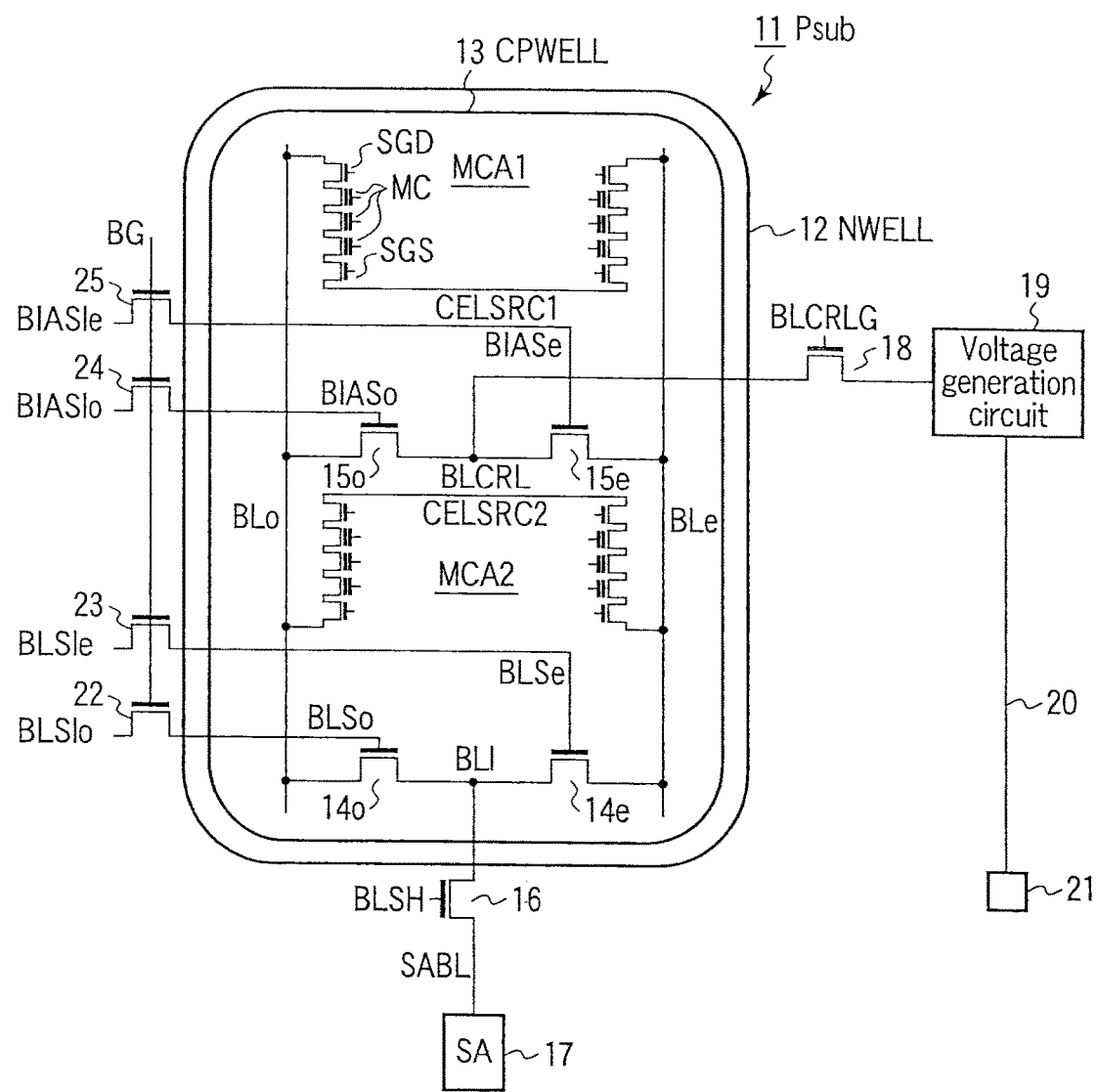
F I G. 4

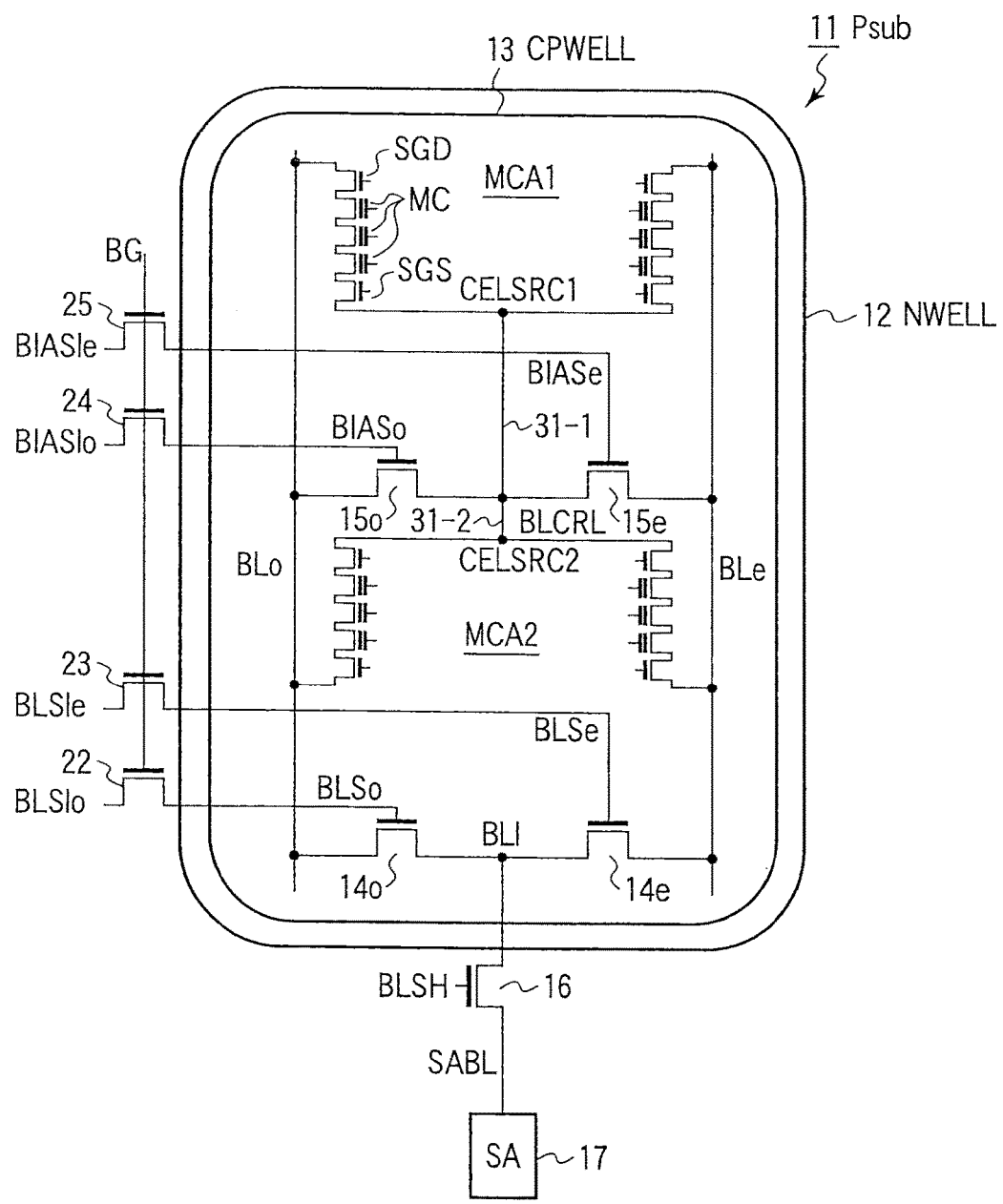
F I G. 5

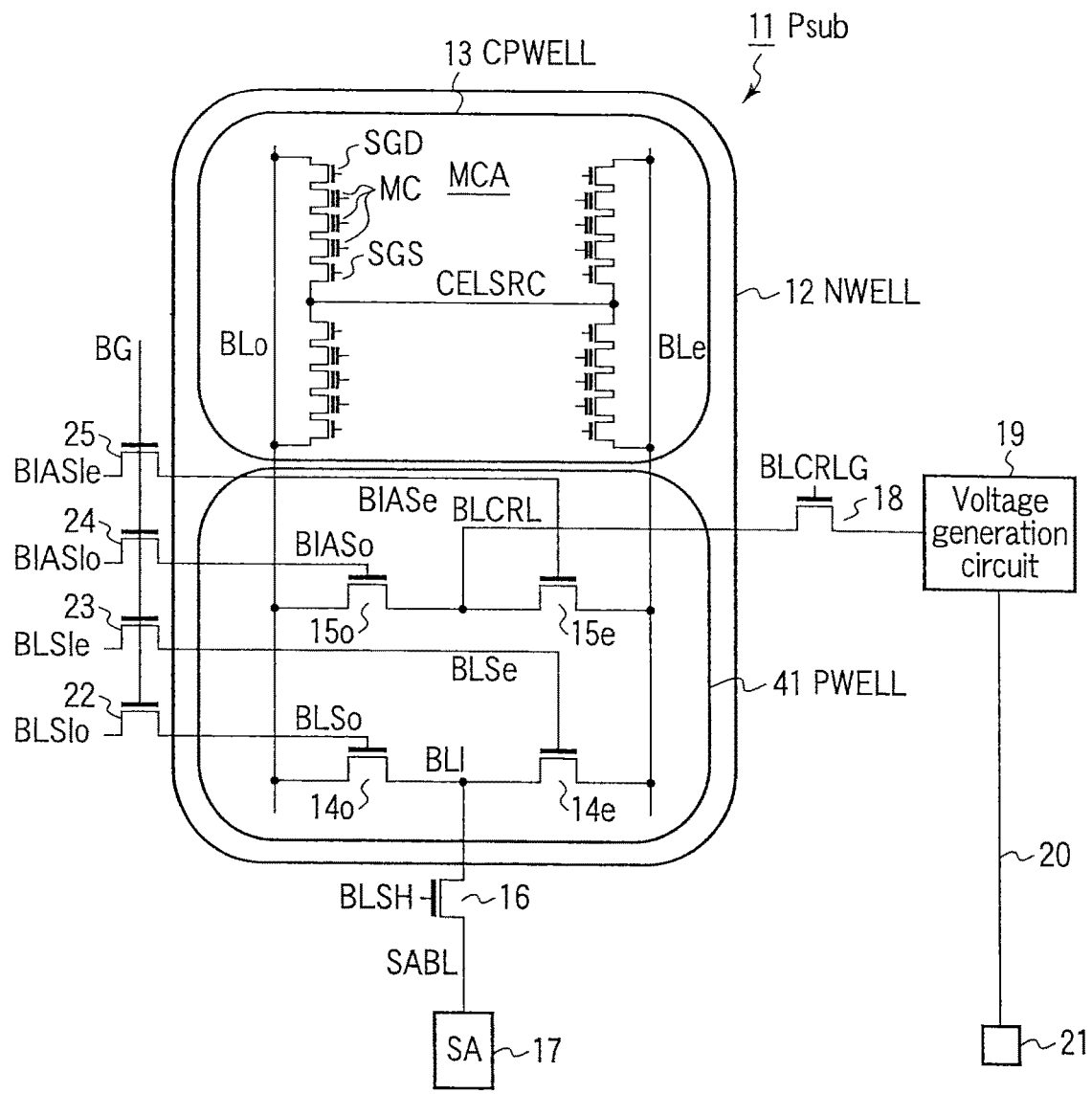
F I G. 6

SEMICONDUCTOR MEMORY DEVICE CAPABLE OF REDUCING CHIP SIZE

CROSS-REFERENCE TO RELATED APPLICATIONS

This application is a continuation of U.S. application Ser. No. 13/608,713 filed Sep. 10, 2012, which is a continuation of U.S. application Ser. No. 12/817,697 filed Jun. 17, 2010, and is based upon and claims the benefit of priority from Japanese Patent Application No. 2009-169258, filed on Jul. 17, 2009; the entire contents of each of which are incorporated herein by reference.

FIELD Embodiments described herein relate generally to a NAND flash memory and to a semiconductor memory device capable of reducing the chip size.

BACKGROUND

In a NAND flash memory, out of a plurality of memory cells arranged in rows and columns, half cells arranged in rows undergo a write or read operation. More specifically, the plurality of cells arranged in columns are connected to even-numbered bit lines BLe or odd-numbered bit lines BLo. In the data write or read mode, one of a pair of bit lines BLe and BLo is connected to a sense amplifier SA via a pair of first bit line select transistors. A signal BLSe or BLSo is supplied to the gate electrodes of these first bit line select transistors. A predetermined BL voltage is applied to an unselected bit line of the pair of bit lines BLe and BLo. For this purpose, a pair of second bit line select transistors are connected to bit lines BLe and BLo. A signal BIASe or BIASo is supplied to the gate electrodes of these second bit line select transistors. One of the second bit line select transistors is selected by signal BIASe or BIASo.

The first and second bit line select transistors are arranged on a p-type substrate (Psub). The memory cell array is provided in a p-type well region (CPWELL) for memory cells, which is formed in an n-type well region (NWELL) formed in the Psub.

In the erase mode of the NAND flash memory, Psub=0V, and NWELL=CPWELL=Vera (erase voltage: for example, 20V) are set, and a plurality of word lines WL included in an erase target block are set to 0V. When the CPWELL is set to Vera, a cell source line CELSRC and the bit lines are forward biased. Hence, the cell source line CELSRC and the bit lines are also set to Vera. The first and second bit line select transistors are provided on the Psub (0V). For this reason, when the bit lines are set to Vera, the voltage Vera is applied to the first and second bit line select transistors as well. It is therefore necessary to form the first and second bit line select transistors using high-voltage transistors. However, the high-voltage transistors have a long channel or large diffusion layer, resulting in a large chip size.

Along with the progress of micropatterning, the pitches between interconnects such as bit lines become narrower. One of the two bit lines BLe and BLo is selected and connected to a sense amplifier bit line SABL. Bit line SABL is connected to the sense amplifier. Since the sense amplifier is formed from a low-voltage transistor, the voltage of bit line SABL needs to be Vdd (2.5V) or less. The first and second bit line select transistors form an interconnect structure in which the bit lines to which Vera is applied are close to bit line SABL to which a voltage less than or equal to Vdd is applied. In such an interconnect structure, as the elements become smaller, it becomes more difficult to hold the breakdown voltage between the interconnects.

A technique of arranging first and second bit line select transistors in a CPWELL has been disclosed (for example, Jpn. Pat. Appln. KOKAI Publication No. 8-46159). In this arrangement, the first and second bit line select transistors are formed in a CPWELL, and can therefore be formed from low-voltage transistors. In this case, however, the first bit line select transistors are arranged on the sense amplifier side with respect to the memory cell array, whereas the second bit line select transistors are arranged on the side opposite to the sense amplifier with respect to the memory cell array. For this reason, a voltage generation circuit for generating a power to drive the second bit line select transistors also needs to be arranged on the side opposite to the sense amplifier with respect to the memory cell array. A power pad is generally arranged on the sense amplifier side. Hence, the interconnect that connects the power pad to the voltage generation circuit is long, resulting in a large chip size.

The read operation of the NAND flash memory will briefly be explained. When bit line BLe is selected out of the pair of bit lines BLe and BLo, signal BLSe supplied to the gate electrode of the first bit line select transistor that selects the bit line goes high, and signal BLSo goes low. Bit line BLe is then connected to the sense amplifier via the first bit line select transistor. In addition, signal BIASo goes high, and signal BIASe goes low so that the second bit line select transistor sets a potential BLCRL in the unselected bit line BLo. Bit lines BLe and BLo are arranged in parallel. For this reason, when bit line BLe is selected, the adjacent bit line BLo is set to the potential BLCRL to serve as a shield for bit line BLe. More specifically, since a cell current flows to the selected bit line BLe because of the threshold voltage of the cell, the potential of bit line BLe is fluctuated. The potential change of bit line BLe does not influence other bit lines BLe. Hence, when bit line BLo serves as a shield, the read margin improves.

The cell current flows to bit line BLe, and then flows into the cell source line CELSRC. When the cell current flows to bit line BLe, the potential of bit line BLe falls. Because of capacitive coupling, the potential of bit line BLo also falls. The potential of bit line BLo is BLCRL. If the voltage generation circuit for generating BLCRL is far from the power pad, the interconnect resistance between the power pad and the voltage generation circuit increases to make it impossible to generate the necessary potential BLCRL. Hence, the shielding effect becomes poor, and the read margin decreases. To prevent this, a semiconductor memory device capable of suppressing an increase in the chip size and preventing a decrease in the read margin is demanded.

BRIEF DESCRIPTION OF THE DRAWINGS

FIG. 1 is a circuit diagram of a main part according to the first embodiment;

FIG. 3 is a circuit diagram of a main part according to the second embodiment;

FIG. 4 is a circuit diagram of a main part according to the third embodiment;

FIG. 5 is a circuit diagram of a main part according to the fourth embodiment;

FIG. 6 is a circuit diagram of a main part according to the fifth embodiment;

FIGS. 9A, 9B, and 9C show the pattern layouts applied to the respective embodiments, in which FIG. 9A is a plan view showing a pattern so as to explain the relationship between bit lines BLe and BLo and first bit line select transistors 14e and 14o, FIG. 9B is a circuit diagram showing the relationship between the bit lines and the bit line select transistors, and FIG. 9C is a view showing the relationship between interconnects and contacts.

DETAILED DESCRIPTION

Figure 2:
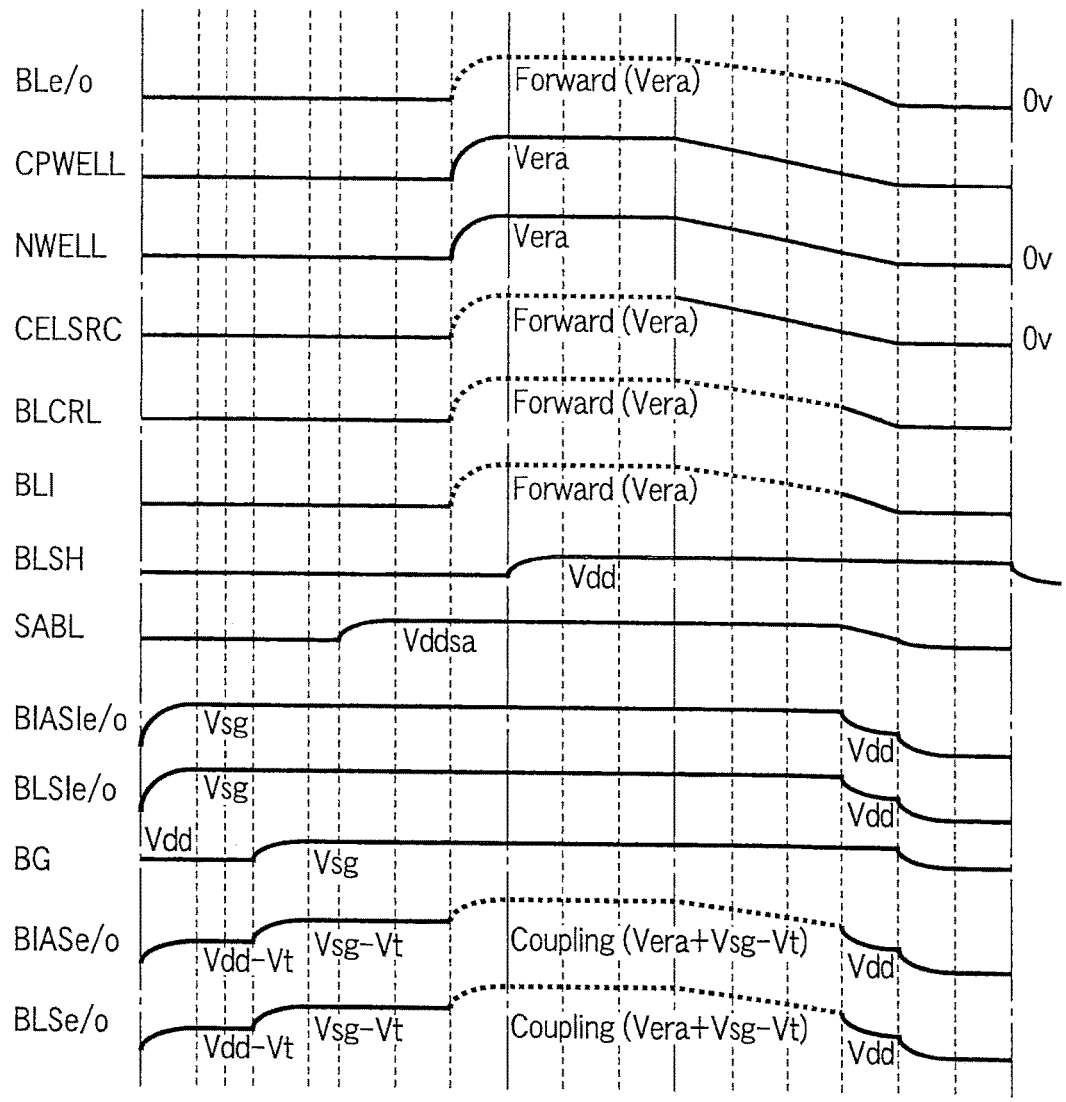
FIG. 2 is a timing chart showing an operation in an erase mode according to the first embodiment.

In general, according to one embodiment, a semiconductor memory device includes a plurality of memory cells of a first conductivity type. A plurality of bit lines are connected to the plurality of memory cells. A plurality of first bit line select transistors of the first conductivity type connect a bit line selected from the plurality of bit lines to a sense amplifier. A plurality of second bit line select transistors of the first conductivity type supply a potential to an unselected bit line of the plurality of bit lines. A first well of the first conductivity type is formed in a substrate. A second well of a second conductivity type is formed in the first well. The plurality of memory cells, the plurality of first bit line select transistors, and the plurality of second bit line select transistors are formed in the second well, and the plurality of first bit line select transistors and the plurality of second bit line select transistors are arranged on a side of the sense amplifier with respect to the plurality of memory cells of the plurality of bit lines.

The embodiments will now be described with reference to the accompanying drawing.

(First Embodiment)

FIG. 1 shows the first embodiment. Note that only an arrangement concerning a pair of bit lines BLe and BLo is shown in each embodiment for the descriptive convenience.

Referring to FIG. 1, an n-type well region (NWELL) 12 is formed in a p-type substrate (Psub) 11. A p-type well region (CPWELL) 13 for memory cells is formed in the NWELL 12. A memory cell array MCA, bit lines BLe and BLo, first bit line select transistors 14e and 14o, and second bit line select transistors 15e and 15o are arranged in the CPWELL 13. The memory cell array MCA is formed from a plurality of NAND strings. Each NAND string includes a plurality of memory cells MC and select transistors SGD and SGS. Select transistor SGS of each NAND string is connected to a cell source line CELSRC. Select transistor SGD of each NAND string is connected to bit line BLe or BLo.

One end of the first bit line select transistor 14e is connected to bit line BLe. One end of first bit line select transistor 14o is connected to bit line BLo. The other end of each of first bit line select transistors 14e and 14o is connected to a node BLI. Node BLI is connected to a sense amplifier 17 via a transistor 16 and a sense amplifier bit line SABL. A signal BLSH is supplied to the gate electrode of the transistor 16.

One end of second bit line select transistor 15e is connected to bit line BLe. One end of second bit line select transistor 15o is connected to bit line BLo. The other end of each of second bit line select transistors 15e and 15o is connected to a node BLCRL. Node BLCRL is connected to a voltage generation circuit 19 via a transistor 18. A signal BLCRLG is supplied to the gate electrode of the transistor 18. The voltage generation circuit 19 is connected to a power pad 21 via an interconnect 20. The power pad 21 is arranged on the side of the sense amplifier 17 with respect to the memory cell array MCA.

The gate electrode of each of first bit line select transistors 14o and 14e and second bit line select transistors 15o and 15e is connected to one end of a corresponding one of transistors 22, 23, 24, and 25. Signals BLSIo, BLSIe, BIASIo, and BIASIe are supplied to the other ends of the transistors 22, 23, 24, and 25, respectively. A signal BG is supplied to their gate electrodes.

First bit line select transistors 14e and 14o and second bit line select transistors 15e and 15o are formed in the CPWELL 13. Hence, these transistors are formed from low-voltage transistors, as will be described later.

On the other hand, the transistors 16, 18, and 22 to 25 are formed in the substrate 11. Hence, these transistors are formed from high-voltage transistors whose breakdown voltages are higher than those of first bit line select transistors 14e and 14o and second bit line select transistors 15e and 15o. The voltage generation circuit 19 formed in the substrate 11 is formed from a low-voltage transistor. For this reason, the voltage generation circuit 19 is protected by the transistor 18.

FIG. 1 illustrates only a pair of bit lines BLe and BLo. However, the number of transistors 22 to 25 does not change regardless of the number of bit lines. Hence, even when the transistors 22 to 25 are formed from high-voltage transistors, the influence on the chip size is small.

FIG. 2 shows an operation in an erase mode. As shown in FIG. 2, first, signals BIASIe and BIASIo (referring to FIG. 2, BIASIe and BIASIo are expressed as BIASIe/o, and other signals and bit lines are also expressed in the same way) and signals BLSIe/o are set to, for example, Vsg (4V), and signal BG is set to, for example, Vsg (4V). Signals BIASe/o supplied to the gate electrodes of second bit line select transistors 15e and 15o and signals BLSe/o supplied to the gate electrodes of first bit line select transistors 14e and 14o are charged to a voltage Vsg−Vthh (Vthh: threshold voltage of a high-voltage transistor). First bit line select transistors 14e and 14o and second bit line select transistors 15e and 15o are set in a floating state.

After that, the CPWELL 13 is charged to an erase voltage Vera (for example, 20V). Bit lines BLe/o, cell source line CELSRC, and node BLI biased forward are thus charged up to Vera. Signals BIASe/o supplied to the gate electrodes of second bit line select transistors 15e and 15o and signals BLSe/o supplied to the gate electrodes of first bit line select transistors 14e and 14o rise to Vsg−Vth+Vera because of coupling between the CPWELL 13 and the gate capacitance. Hence, in first bit line select transistors 14e and 14o and second bit line select transistors 15e and 15o, gate-to-source voltage Vgs, drain-to-source voltage Vds, and substrate-to-source voltage Vbs are not high. Hence, no stress is applied to these transistors in the erase mode.

The erase voltage Vera is applied and then removed. That is, the CPWELL 13, NWELL 12, and cell source line CELSRC are discharged. Bit lines BLe/o are discharged because of capacitive coupling to the cell source line CELSRC and the CPWELL 13. On condition that Vsg−Vthh (Vthh: threshold voltage of a high-voltage transistor)>Vth1 (Vth1: threshold voltage of a low-voltage transistor), first bit line select transistors 14e and 14o and second bit line select transistors 15e and 15o are on. For this reason, nodes BLI and BLCRL are equipotential to bit lines BLe/o. Hence, nodes BLI and BLCRL are discharged like bit lines BLe/o. Bit lines BLe/o may not completely be discharged because the discharge occurs because of capacitive coupling. To prevent this, the potential of the CPWELL 13 is detected. When the potential has reduced to about Vdd (2.5V), signals BLSe/o, BIASe/o, and BLSH are set to Vdd to cause discharge from the side of the sense amplifier 17 as well.

According to the first embodiment, when the erase voltage Vera is supplied to the CPWELL 13 in the erase mode, the NWELL 12, cell source line CELSRC, bit lines BLe and BLo, and nodes BLCRL and BLI are set to the erase voltage Vera. However, since first bit line select transistors 14e and 14o and second bit line select transistors 15e and 15o are arranged on the CPWELL 13, no high voltages are applied as the gate-to-source voltage Vgs, drain-to-source voltage Vds, and substrate-to-source voltage Vbs of these transistors 14e, 14o, 15e, and 15o. Hence, first bit line select transistors 14e and 14o and second bit line select transistors 15e and 15o can be formed from low-voltage transistors. This enables to reduce the chip size.

All bit lines BLe and BLo and node BLI connected to first bit line select transistors 14e and 14o and second bit line select transistors 15e and 15o are set to the erase voltage Vera in the erase mode. For this reason, no potential difference is generated between the interconnects or between the interconnects and contacts. This prevents the breakdown voltage between the interconnects or between the interconnects and contacts from lowering even when micropatterning progresses.

All first bit line select transistors 14e and 14o and second bit line select transistors 15e and 15o are arranged on the side of the sense amplifier 17 with respect to the memory cell array MCA. For this reason, the voltage generation circuit 19 that supplies the potential BLCRL of an unselected bit line to second bit line select transistors 15e and 15o can be arranged near the power pad 21. It is therefore possible to shorten interconnect 20 and thus suppress an increase in the interconnect resistance. This allows the voltage generation circuit 19 to reliably generate the potential BLCRL so as to ensure the shielding effect of the unselected bit line. Hence, a decrease in the read margin can be prevented.

(Second Embodiment)

FIG. 3 shows the second embodiment. The same reference numerals as in FIG. 1 denote the same parts in FIG. 3. In the first embodiment, the voltage generation circuit 19 generates the potential of the unselected bit line. The voltage generation circuit 19 is formed from a low-voltage transistor, and needs to be protected by the high-voltage transistor 18. The voltage generated by the voltage generation circuit 19 is supplied to the unselected bit line in the read mode so as to serve a shield power supply. To reduce the on-resistance of the high-voltage transistor 18, the size of the transistor needs to be increased. However, this leads to an increase in the chip size.

In the second embodiment, as shown in FIG. 3, a node BLCRL and a cell source line CELSRC are connected by an interconnect 31 to allow omission of the voltage generation circuit 19 and the transistor 18.

In this arrangement, for example, when a signal BLSe goes high, and a signal BLSo goes low to turn on a first bit line select transistor 14e and off a first bit line select transistor 14o, a bit line BLe is selected, and a bit line BLo is unselected. At this time, a signal BIASe goes low, and a signal BIASo goes high to turn off a second bit line select transistor 15e and on a second bit line select transistor 15o. When data is read out from memory cells connected to bit line BLe, a cell current flows to the cell source line CELSRC. When the cell current flows, the potential of bit line BLe falls. Since adjacent bit lines BLe and BLo are close to each other and influenced by capacitive coupling, the potential of bit line BLo also falls. On the other hand, the potential of the cell source line CELSRC rises because the cell current flows in. A potential corresponding to the increase in the potential of the cell source line CELSRC is supplied to unselected bit line BLo, thereby compensating for the potential drop of bit line BLo. More specifically, the cell current is supplied to unselected bit line BLo via interconnect 31 and second bit line select transistor 15o. This causes bit line BLo to generate a shielding effect.

According to the second embodiment, interconnect 31 connects the cell source line CELSRC to the connection node BLCRL of second bit line select transistors 15e and 15o to supply a current flowing to the cell source line CELSRC to the unselected bit line via the interconnect and the second bit line select transistor in the on state. This obviates the need for providing a voltage generation circuit or a protective high-voltage transistor. It is therefore possible to prevent an increase in the chip size and ensure the read margin.

(Third Embodiment)

FIG. 4 shows the third embodiment. The same reference numerals as in the first embodiment denote the same parts in the third embodiment.

In the first embodiment, first bit line select transistors 14e and 14o and second bit line select transistors 15e and 15o are arranged at end portions of bit lines BLe and BLo on the side of the sense amplifier 17 with respect to the memory cell array MCA.

In the third embodiment, a memory cell array MCA is divided into two memory cell arrays MCA1 and MCA2. First bit line select transistors 14e and 14o are arranged on the end portions of bit lines BLe and BLo on the side of a sense amplifier 17 with respect to memory cell array MCA2. Second bit line select transistors 15e and 15o are arranged at the longitudinal central portions of bit lines BLe and BLo between memory cell arrays MCA1 and MCA2. A node BLCRL of second bit line select transistors 15e and 15o are connected to a voltage generation circuit 19 via a protective transistor 18.

According to the third embodiment, second bit line select transistors 15e and 15o are arranged at the longitudinal central portions of bit lines BLe and BLo between memory cell arrays MCA1 and MCA2 to supply a voltage generated by the voltage generation circuit 19 to the longitudinal central portion of the unselected bit line. As the capacity of the memory cell array MCA increases, bit lines BLe and BLo tend to be longer and make their time constants larger. For this reason, when a voltage is supplied to the end portions of bit lines BLe and BLo, voltage supply to the entire bit lines BLe and BLo takes long time. However, when a voltage is supplied to the longitudinal central portions of bit lines BLe and BLo, as in the third embodiment, the time constants can relatively be made small so that the time necessary for voltage supply to the entire bit lines BLe and BLo can shorten. Since the voltage can quickly be supplied to the unselected bit line, the shielding effect and the read margin can be improved.

(Fourth Embodiment)

FIG. 5 shows the fourth embodiment. The fourth embodiment is a combination of the third embodiment and the second embodiment. The same reference numerals as in the second and third embodiments denote the same parts in the fourth embodiment.

As shown in FIG. 5, first bit line select transistors 14e and 14o are arranged on the end portions of bit lines BLe and BLo on the side of a sense amplifier 17 with respect to a memory cell array MCA2. Second bit line select transistors 15e and 15o are arranged at the longitudinal central portions of bit lines BLe and BLo between memory cell arrays MCA1 and MCA2. An interconnect 31-1 is connected between a cell source line CELSRC1 of memory cell array MCA1 and a connection node BLCRL of second bit line select transistors 15e and 15o. An interconnect 31-2 is connected between a cell source line CELSRC2 of memory cell array MCA2 and the connection node BLCRL of second bit line select transistors 15e and 15o. Potential supply to the unselected bit line is done using interconnects 31-1 and 31-2.

According to the fourth embodiment, the time required for voltage supply to the entire bit lines BLe and BLo can shorten. Since the voltage can quickly be supplied to the unselected bit line, the shielding effect and the read margin can be improved. In addition, since the voltage generation circuit and the protective transistor are unnecessary, an increase in the chip size can also be prevented.

(Fifth Embodiment)

FIG. 6 shows the fifth embodiment. The fifth embodiment is a modification of the first embodiment. More specifically, in the first embodiment, first bit line select transistors 14e and 14o and second bit line select transistors 15e and 15o are formed in the CPWELL 13 together with the memory cell array MCA. The impurity concentration of the CPWELL 13 is optimized for the memory cells MC and select transistors SGD and SGS, which form NAND strings. However, the impurity concentration is not optimum for first bit line select transistors 14e and 14o and second bit line select transistors 15e and 15o.

In the fifth embodiment, first bit line select transistors 14e and 14o and second bit line select transistors 15e and 15o are formed in a p-type well region PWELL 41 different from a CPWELL 13. More specifically, the PWELL 41 is formed in an NWELL 12 separately from the CPWELL 13. The impurity concentration of the PWELL 41 is optimized for first bit line select transistors 14e and 14o and second bit line select transistors 15e and 15o, unlike the CPWELL 13. This allows optimization of the characteristics such as the threshold voltages and current driving capabilities of first bit line select transistors 14e and 14o and second bit line select transistors 15e and 15o.

In the erase mode, an erase voltage Vera is applied to the PWELL 41, like the CPWELL 13. More specifically, the operation is the same as that shown in FIG. 2, and the same voltage as that for the CPWELL in FIG. 2 is applied to the PWELL 41. Hence, first bit line select transistors 14e and 14o and second bit line select transistors 15e and 15o can be formed from low-voltage transistors, and drop in the breakdown voltage between the interconnects does not occur.

Note that combining the fifth embodiment with the second embodiment enables to omit a voltage generation circuit 19 and a protective transistor 18 and thus prevent an increase in the chip size.

According to the fifth embodiment, first bit line select transistors 14e and 14o and second bit line select transistors 15e and 15o are formed in the PWELL 41 different from the CPWELL 13. This allows optimization of the impurity concentration of the PWELL 41 for first bit line select transistors 14e and 14o and second bit line select transistors 15e and 15o and thus improve the characteristics of first bit line select transistors 14e and 14o and second bit line select transistors 15e and 15o. In addition, since first bit line select transistors 14e and 14o and second bit line select transistors 15e and 15o can be formed from low-voltage transistors, an increase in the chip size can also be prevented.

(Sixth Embodiment)

Figure 7:
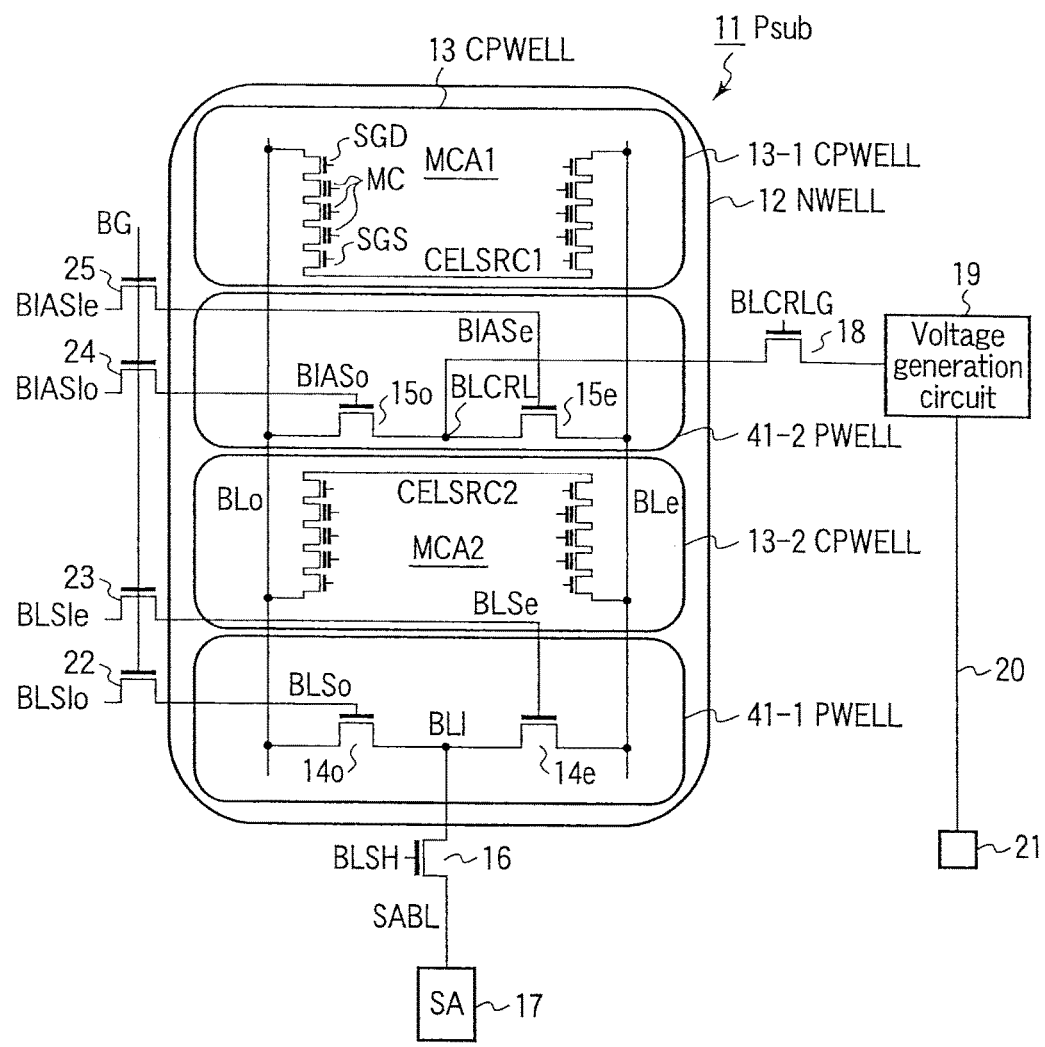
FIG. 7 is a circuit diagram of a main part according to the sixth embodiment.

FIG. 7 shows the sixth embodiment. The sixth embodiment is a combination of the fifth embodiment and the third embodiment. More specifically, as shown in FIG. 7, a CPWELL 13 is divided into CPWELLs 13-1 and 13-2. A PWELL 41 is divided into PWELLs 41-1 and 41-2. Memory cell arrays MCA1 and MCA2 are formed in CPWELLs 13-1 and 13-2, respectively. First bit line select transistors 14e and 14o are formed in PWELL 41-1. Second bit line select transistors 15e and 15o are formed in PWELL 41-2. The impurity concentrations of PWELLs 41-1 and 41-2 are optimized for first bit line select transistors 14e and 14o and second bit line select transistors 15e and 15o, unlike CPWELLs 13-1 and 13-2. This allows optimization of the characteristics such as the threshold voltages and current driving capabilities of first bit line select transistors 14e and 14o and second bit line select transistors 15e and 15o.

In the erase mode, an erase voltage Vera is applied to CPWELLs 13-1 and 13-2 and PWELLs 41-1 and 41-2. Hence, first bit line select transistors 14e and 14o and second bit line select transistors 15e and 15o can be formed from low-voltage transistors, and drop in the breakdown voltage between the interconnects does not occur.

According to the sixth embodiment, first bit line select transistors 14e and 14o and second bit line select transistors 15e and 15o are formed in PWELLs 41-1 and 41-2 different from CPWELLs 13-1 and 13-2. This allows optimization of the characteristics such as the threshold voltages and current driving capabilities of first bit line select transistors 14e and 14o and second bit line select transistors 15e and 15o.

In addition, supplying a voltage to the longitudinal central portions of bit lines BLe and BLo allows shortening of the time necessary for voltage supply to the entire bit lines BLe and BLo. Since the voltage can quickly be supplied to the unselected bit line, the shielding effect and the read margin can be improved.

Note that the sixth embodiment may be combined with the fourth embodiment. In this case, it is possible to omit a voltage generation circuit 19 and a protective transistor 18, and prevent an increase in the chip size.

(Pattern Layout)

Figure 8A:
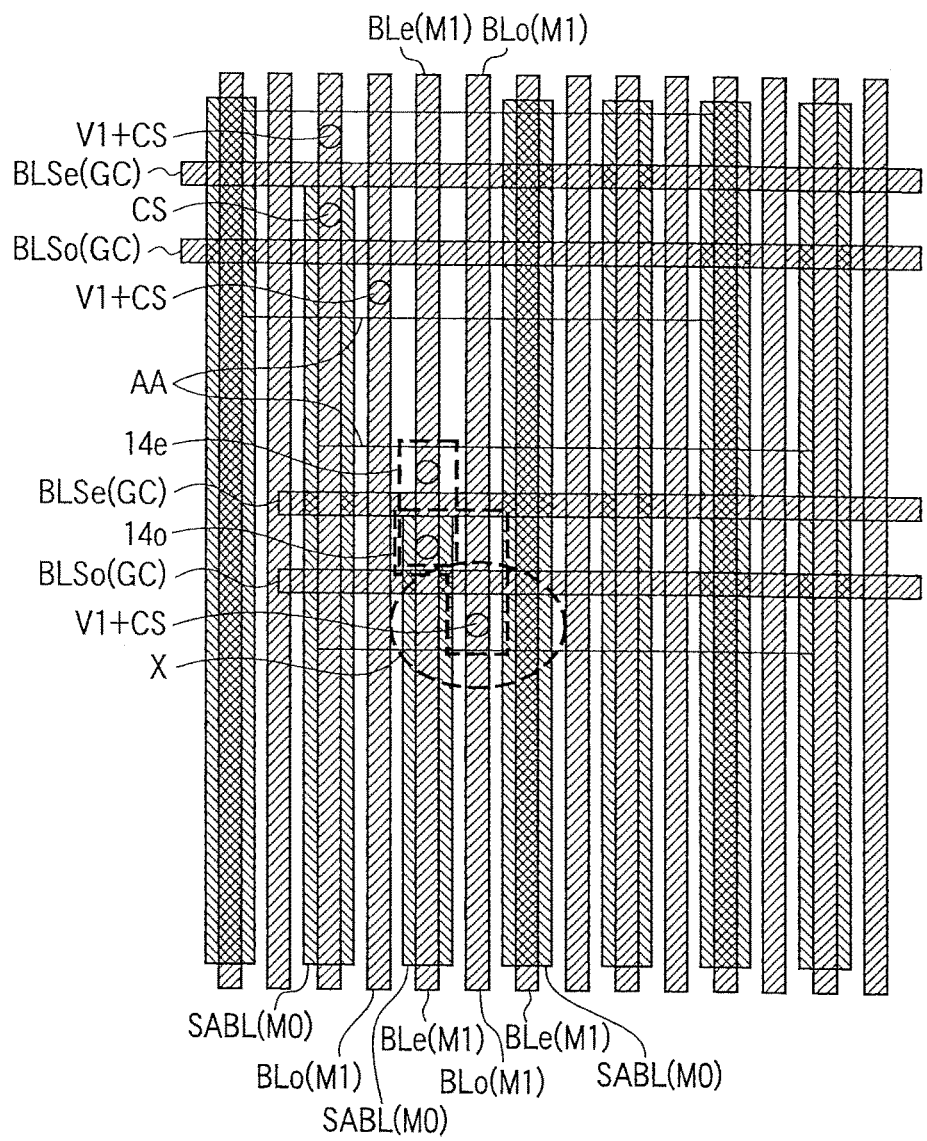
FIG. 8A is a plan view showing a pattern so as to explain the relationship between bit lines BLe and BLo and first bit line select transistors 14e and 14o.
Figure 8B:
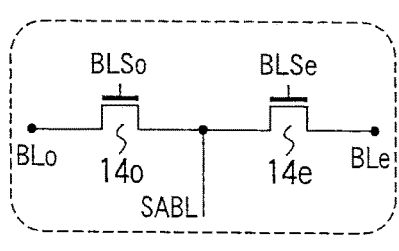
FIG. 8B is a circuit diagram showing the relationship between the bit lines and the bit line select transistors.
Figure 8C:
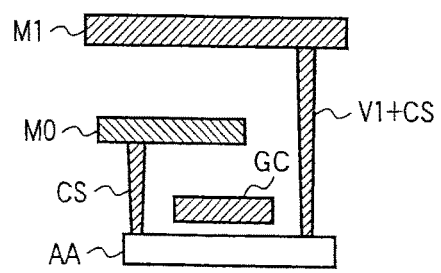
FIG. 8C is a view showing the relationship between interconnects and contacts.

FIG. 8A is a plan view showing the pattern of bit lines BLe and BLo and first bit line select transistors 14e and 14o. FIG. 8B is a circuit diagram showing the relationship between bit lines BLe and BLo and first bit line select transistors 14e and 14o. FIG. 8C is a view showing the relationship between interconnects and contacts.

As described above, bit lines BLe and BLo are selected by first bit line select transistors 14e and 14o and connected to bit line SABL connected to the sense amplifier 17. As shown in FIGS. 8A, 8B, and 8C, bit lines BLe and BLo are arranged in a metal interconnect layer M1 (to be referred to as the M1 layer hereinafter) at a predetermined pitch. Bit lines SABL are arranged in a metal interconnect layer M0 (to be referred to as the M0 layer hereinafter) under the M1 layer at a pitch twice that of bit lines BLe and BLo. First bit line select transistors 14e and 14o are formed by an active region AA and BLSe and BLSo (GC layers) serving as gate electrodes. The BLSe and BLSo (GC layers) are arranged under the M0 layer in a direction perpendicular to bit lines BLe, BLo, and SABL. Bit lines BLe and BLo and first bit line select transistors 14e and 14o are connected via contacts V1+CS in the active region AA. Additionally, first bit line select transistors 14e and 14o and bit lines SABL are connected via contacts CS in the active region AA.

In the above-described arrangement, the contacts V1+CS which connect one pair of bit lines BLe and BLo to first bit line select transistors 14e and 14o are sometimes formed between two adjacent bit lines SABL, as indicated by a broken line X. First bit line select transistors 14e and 14o are formed in the well region, as described above, and therefore have no problem of breakdown voltage. In this case, however, if the contact pattern shifts in the lithography process, bit lines SABL and bit lines BLe and BLo may short-circuit.

Figure 9A:
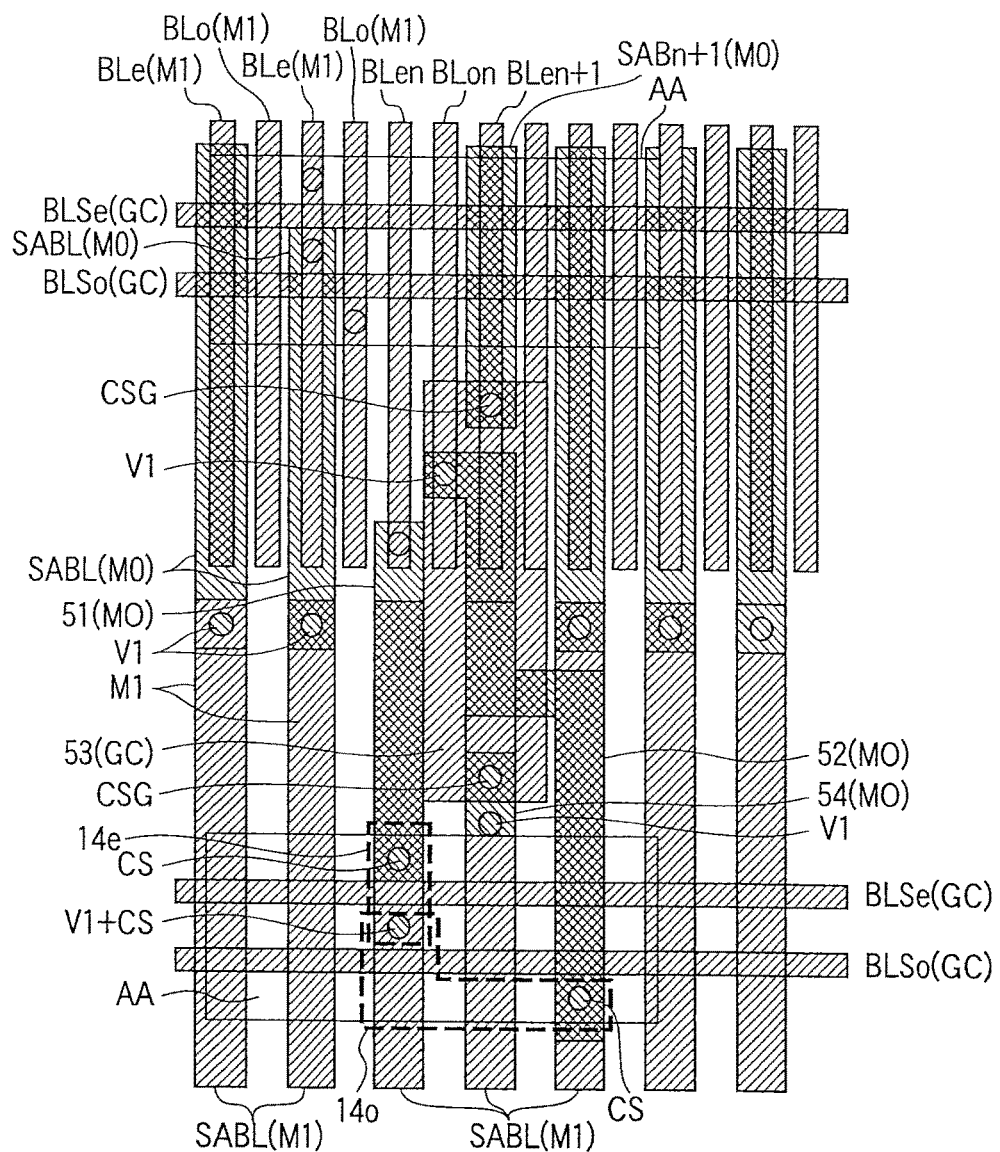
Figure 9B:
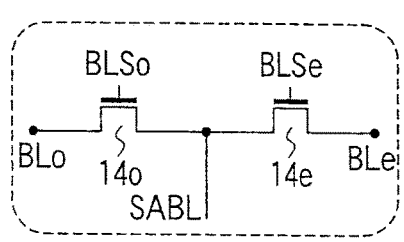
Figure 9C:
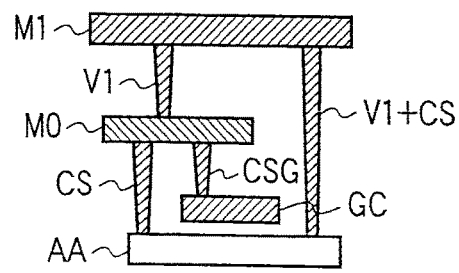

FIG. 9A is a plan view of a pattern applied to each of the above-described embodiments. FIG. 9B is a circuit diagram showing the relationship between the bit lines and the bit line select transistors. FIG. 9C is a view showing the relationship between the interconnects and the contacts. In the arrangement shown in FIG. 8A, the active region AA under bit lines BLe and BLo is formed, and bit lines BLe and BLo are connected to first bit line select transistors 14e and 14o and bit lines SABL in the active region AA.

On the other hand, in the arrangement shown in FIG. 9A, bit lines BLe and BLo are terminated at the same position. At a portion where the interval between the contacts of bit lines BLe and BLo and bit lines SABL is narrow, the active region AA has no bit lines BLe and BLo above it. In addition, the interconnects are prolonged from bit lines BLe and BLo to the active region AA via the M0 layer or CG layer.

More specifically, as shown in FIGS. 9A, 9B, and 9C, the plurality of bit lines BLe and BLo in the M1 layer are terminated at the same position. Most bit lines SABL formed in the M0 layer under the M1 layer are terminated near bit lines BLe and BLo. Bit lines SABL are arranged at a pitch twice that of bit lines BLe and BLo. Bit lines SABL are connected to bit lines SABL in the M1 layer via the contacts V1.

On the other hand, no bit lines SABL in the M0 layer are formed under bit lines BLen and BLon that are not directly connected to first bit line select transistors 14e and 14o. Bit lines BLen and BLon are connected to end portions of interconnects 51 and 52 in the M0 layer via the contacts V1, respectively. The other end portions of interconnects 51 and 52 are connected to the active region AA via the contacts CS. Interconnect 52 is bent and connected to the active region AA at a position far apart by a distance four times the pitch of bit lines BLe and BLo. The active region AA is formed at a position far apart from the lower portion of the terminated bit lines BLe and BLo.

The BLSe and BLSo serving as the gate electrodes of first bit line select transistors 14e and 14o are formed in the GC layers above the active region AA. Bit lines SABL in the M1 layer are formed above BLSe and BLSo in a direction perpendicular to BLSe and BLSo. The contact node between first bit line select transistor 14e and first bit line select transistor 14o is connected to bit line SABL via the contact V1+CS.

A bit line SABL+1 arranged under a bit line BLen+1 adjacent to bit line BLon is connected, via a contact CSG, to one end portion of an interconnect 53 arranged in the GC layer. Interconnect 53 is formed under interconnect 52. The other end portion of interconnect 53 is connected, via the contact CSG, to an interconnect 54 formed in the M0 layer. Interconnect 54 is connected to bit line SABL in the M1 layer via the contact V1.

According to the above-described pattern layout, the specific active region AA is formed separately from the ends of bit lines BLe and BLo in the horizontal direction. Bit lines BLe and BLo are connected to the active region AA in the region of interconnect layers that are arranged at a pitch twice that of bit lines BLe and BLo. This prevents the contacts of bit lines BLe and BLo and the active region AA from being formed between adjacent bit lines SABL. It is therefore possible to prevent short-circuit between bit lines BLe and BLo and bit line SABL.

Since bit lines BLe and BLo can be terminated at the same position, any restrictions on lithography of bit lines BLe and BLo imposed by the decrease in the element size can be avoided. This facilitates manufacturing and improves yield.

First bit line select transistors 14e and 14o are formed in the CPWELL or PWELL. For this reason, first bit line select transistors 14e and 14o can be formed from low-voltage transistors. This enables to suppress an increase in the chip size.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory cells of a first conductivity type, wherein the plurality of memory cells are connected to a source line;
   a plurality of bit lines connected to the plurality of memory cells;
   a plurality of first bit line select transistors of the first conductivity type which are connected at one end to the source line, and which select a bit line from the plurality of bit lines and connect the selected bit line to a sense amplifier;
   a plurality of second bit line select transistors of the first conductivity type which select an unselected bit line of the plurality of bit lines and supply a potential to the unselected bit line;
   a first well of the first conductivity type which is formed in a substrate; and
   a second well of a second conductivity type which is formed in the first well,
   wherein the plurality of memory cells, the plurality of first bit line select transistors, and the plurality of second bit line select transistors are formed in the second well, and
   wherein the plurality of first bit line select transistors and the plurality of second bit line select transistors are arranged between the sense amplifier and the plurality of the memory cells.

2. The device according to claim 1, wherein the plurality of the second bit line select transistors supply a potential of the source line to the unselected bit line.

3. The device according to claim 1, wherein the plurality of memory cells are connected to a plurality of source lines, respectively, and the plurality of second bit line select transistors are arranged at longitudinal central portions of the plurality of bit lines.

4. The device according to claim 3, wherein the plurality of second bit line select transistors supply a potential of the plurality of source lines to the unselected bit line.

5. The device according to claim 1, wherein the plurality of memory cells form NAND strings.

6. The device according to claim 1, further comprising:
an active region of the pair of first bit line select transistors, which is formed separately from one end of each of a first bit line and a second bit line;
a first interconnected layer and a second interconnect layer which are arranged at a pitch twice a pitch of the first bit line and the second bit line and connected to the first bit line and the second bit line, respectively, the first interconnect layer and the second interconnect layer being located under the first bit line and the second bit line;
a third interconnect layer which is arranged along the first interconnect layer at the same level as that of the first bit line and the second bit line, and connected to the sense amplifier;
a first contact which connects the first interconnect layer to the active region;
a second contact which connects the second interconnect layer to the active region; and
a third contact which connects the third interconnect layer to the active region serving as a connection node of the pair of first bit line select transistors.

7. The device according to claim 1, further comprising:
a plurality of select transistors adjacent to one of the plurality of memory cells,
wherein each of the bit lines is connected to one of the plurality of select transistors.

8. The device according to claim 1, wherein the potential to the unselected bit line is a source line voltage.

9. A semiconductor memory device comprising:
a plurality of memory cells of a first conductivity type which form a first NAND string and a second NAND string, wherein one end of the NAND string and the second NAND string is connected to a source line;
a first bit line to which the other end of the first NAND string is connected;
a second bit line to which the other end of the second NAND string is connected;
a pair of first bit line select transistors of the first conductivity type which are connected at one end to the first source line, and which select a bit line from the first bit line and the second bit line and connect the selected bit line to a sense amplifier;
a pair of second bit line select transistors of the first conductivity type which select an unselected bit line of the first bit line and the second bit line and supply a potential to the unselected bit line;
a first well of the first conductivity type which is formed in a substrate; and
a second well of a second conductivity type which is formed in the first well,
wherein the first NAND string, the second NAND string, the first bit line select transistors, and the second bit line select transistors are formed in the second well, and
wherein the first bit line select transistors and the second bit line select transistors are arranged between the sense amplifier and the plurality of memory cells of the plurality of bit lines.

10. The device according to claim 9, wherein a connection node of the pair of second bit line select transistors is connected to the source line, and the pair of second bit line select transistors supply a potential of the second source line to the unselected bit line.

11. The device according to claim 9, further comprising:
a third NAND string connected to the first bit line; and
a fourth NAND string connected to the second bit line.

12. The device according to claim 11, wherein
an end of each of the third NAND string and the fourth NAND string is connected to a second source line, and
the pair of the second bit line select transistors are arranged at longitudinal central portions of the first bit line and the second bit line.

13. The device according to claim 12, wherein the pair of second bit line select transistors have a connection node connected to the first source line and the second source line, and supply a potential of the first source line and the second source line to the unselected bit line.

14. The device according to claim 9, further comprising:
an active region of the pair of first bit line select transistors, which is formed separately from one end of each of the first bit line and the second bit line;
a first interconnect layer and a second interconnect layer which are arranged at a pitch twice a pitch of the first bit line and the second bit line and connected to the first bit line and the second bit line, respectively, the first interconnect layer and the second interconnect layer being located under the first bit line and the second bit line;
a third interconnect layer which is arranged along the first interconnect layer at the same level as that of the first bit line and the second bit line, and connected to the sense amplifier;
a first contact which connects the first interconnect layer to the active region;
a second contact which connects the second interconnect layer to the active region; and
a third contact which connects the third interconnect layer to the active region serving as a connection node of the pair of first bit line select transistors.

15. The device according to claim 9, further comprising:
a plurality of select transistors adjacent to the first NAND string or the second NAND string,
wherein each of the bit lines is connected to one of the plurality of select transistors.

16. The device according to claim 9, wherein the potential to the unselected bit line is a source line voltage.

* * * * *